United States Patent [19]

Susak et al.

[11] Patent Number: 4,713,626
[45] Date of Patent: Dec. 15, 1987

[54] OPERATIONAL AMPLIFIER UTILIZING JFET FOLLOWERS

[75] Inventors: David M. Susak, Mesa; Robert L. Vyne, Tempe, both of Ariz.

[73] Assignee: Motorola Inc., Schaumburg, Ill.

[21] Appl. No.: 947,127

[22] Filed: Dec. 29, 1986

[51] Int. Cl.$^4$ .............................................. H03F 3/45
[52] U.S. Cl. ..................................... 330/253; 330/257
[58] Field of Search ............... 330/252, 253, 257, 310; 307/310, 580

[56] References Cited

U.S. PATENT DOCUMENTS 4,517,524 5/1985 Davis .................................. 330/257

Primary Examiner—Gene Wan
Attorney, Agent, or Firm—Dale E. Jepsen

[57] ABSTRACT

An operational amplifier includes a pair of differentially coupled PNP transistors driving a current mirror circuit. The base of the each of the transistors is coupled to the source of a JFET follower transistor each of which in turn has a gate coupled to one of the amplifier's inputs. First and second current sources are coupled to the source electrodes of each of the JFETs for the purpose of supplying a current thereto equal to that JFET's $I_{DSS}$ (its drain current when its gate and source are shorted).

5 Claims, 2 Drawing Figures

OPERATIONAL AMPLIFIER UTILIZING JFET FOLLOWERS

BACKGROUND OF THE INVENTION

This invention relates generally to operational amplifiers, and more particularly, to an operational amplifier utilizing JFET followers each of which is driven by a current source generating a current which is proportional to the saturation current $I_{DSS}$ of its respective JFET follower and which tracks its respective $I_{DSS}$ over temperature.

In an operational amplifier which utilizes JFET followers for driving a PNP differential stage, it is desirable that the JFETs be supplied each with a current equal to $I_{DSS}$ (the drain current when the gate and source terminals are shorted) and in this manner provide a gate-to-source voltage ($V_{gs}$) equal to zero and having a temperature coefficient equal to zero (i.e. $dV_{gs}/dT=0$). Furthermore, with Vgs on both sides of the amplifier (i.e. $V_{gs1}$ and $V_{gs2}$) equal to zero, the offset voltage $V_{os}$ which equals $V_{gs1}-V_{gs2}$ would also equal zero and $dV_{os}/dT$ would equal zero. Unfortunately, in the past, the required currents equal to $I_{DSS}$ of the JFET followers could not be assured sufficiently to achieve consistently acceptable results.

SUMMARY OF THE INVENTION

It is an object of the present invention to provide an improved operational amplifier circuit utilizing JFET followers.

It is a further object of the present invention to provide an operational amplifier circuit utilizing JFET followers wherein each JFET follower is supplied with a current equal to $I_{DSS}$ of the JFET and which tracks $I_{DSS}$ over temperature.

According to a broad aspect of the invention there is provided an amplifier having first and second inputs, comprising first and second emitter coupled transistors. Current mirror means is coupled to the collectors of said first and second transistor. A first JFET has a source coupled to the base of said first transistor, a gate coupled to the first input, and has a first $I_{DSS}$. A second JFET has a source coupled to the base of the second transistor, a gate coupled to said second input, and has a second $I_{DSS}$. First means is coupled to the source of the first JFET for supplying a first current thereto substantially equal to its IDSS; and second means coupled to the source of the second JFET for supplying a second current thereto substantially equal to its $I_{DSS}$.

The above and other objects, features and advantages of the present invention will be more clearly understood from the following detailed description taken in conjunction with the accompanying drawings, in which:

DESCRIPTION OF THE PREFERRED EMBODIMENT

Figure 1:
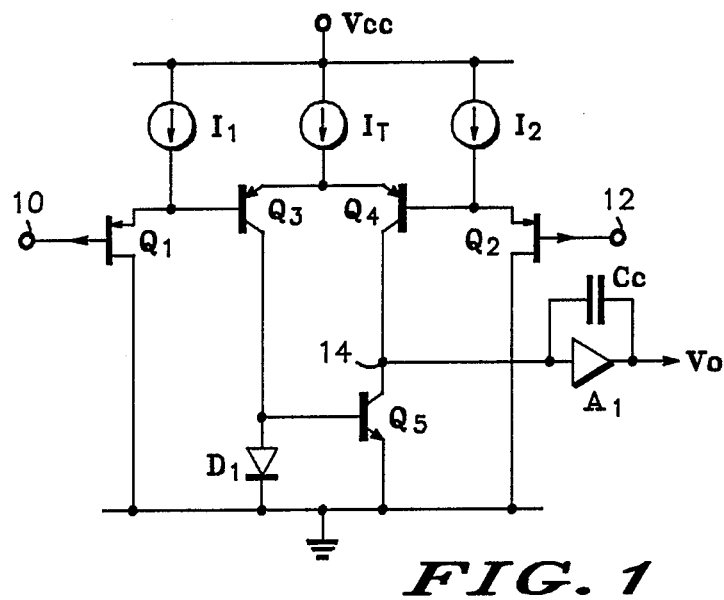
FIG. 1 is a schematic diagram of the inventive operational amplifier circuit.

The operational amplifier shown in FIG. 1 includes a pair of emitter coupled PNP transistors Q3 and Q4 each of which have their collectors coupled to a current mirror circuit comprised of diode means D1 and NPN transistor Q5. That is, the collector of PNP transistor Q3 is coupled to the anode of diode D1 and to the base of transistor Q5. The collector of transistor Q4 is coupled to the collector of transistor Q5. Both the cathode of diode D1 and emitter of transistor Q5 are coupled to a source of supply voltage (e.g. ground). The tail current required by this circuitry is provided by a current source It coupled between the emitters of transistors Q3 and Q4 and another source of supply voltage ($V_{CC}$). The base electrodes of transistors Q3 and Q4 are coupled respectively to the source electrodes of junction field-effect-transistors (JFETs) Q1 and Q2 respectively each of which have a drain coupled to ground. Q1 has a gate terminal coupled to a first input terminal 10, and Q2 has a gate coupled to a second input terminal 12. The remainder of the operational amplifier represented by amplifier Al having an input coupled to the collector junction of transistors Q4 and Q5, the output of which ($V_0$) represents the amplifier output, and a compensation capacitor Cc coupled in parallel with amplifier $A_1$). Finally, current sources I1 and I2 are provided for driving junction field-effecttransistors Q1 and Q2 respectively, and it is the nature of these current sources and their relationship to the circuit as a whole which renders the circuit shown in FIG. 1 inventive.

The gate to source voltage ($V_{gs}$) of a JFET may be represented as $$V_{gs} = V_p(1 - \sqrt{I_D/I_{DSS}}) \tag{1}$$

where $V_p$ is a pinch-off voltage of the JFET, $I_D$ is the drain current and $I_{DSS}$ represents the JFET's drain current when its gate and source are shorted. The amplifier's offset voltage ($V_{os}$) may then be represented as the difference between the gate to source voltage of Q2 and Q1 or $$V_{os} = V_{gsQ2} - V_{gsQ1} \tag{2}$$

By substituting, there is obtained $$V_{os} = V_{pQ2}(1 - \sqrt{I_2/I_{DSSQ2}}) - V_{pQ1}(1 - \sqrt{I_1/I_{DSSQ1}}) \tag{3}$$

If $dI_2/dT = dI_{DSSQ2}/dT$ and $dI_1/dT = dI_{DSSQ1}/dt$ the rate of change of the offset voltage with respect to temperature may be represented as $$dV_{os}/dT = (dV_{pQ2}/dT)(1 - \sqrt{I_2/I_{DSSQ2}}) - \tag{4}$$

$$(dV_{pQ1}/dT)(1 - \sqrt{I_1/I_{DSSQ1}})$$

It can be seen that if I2 is substantially equal to $I_{DSSQ2}$ and $I_1$ is substantially equal to $I_{DSSQ1}$, then both the offset voltage $V_{os}$ and the rate of change of $V_{os}$ with temperature ($dV_{os}/dT$) equals zero. That is, by trimming the offset voltage to zero, $dV_{os}/dT$ is also automatically trimmed to zero.

Figure 2:
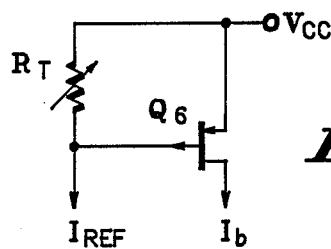
FIG. 2 is a schematic diagram of a current source for generating currents I1 and I2 in FIG. 1.

Current sources I1 and I2 may be generated by the circuit shown in FIG. 2 which is described in copending U.S. application Ser. No. SC05986C entitled TRIMMABLE CURRENT SOURCE and assigned to the assignee of the present invention.

Referring to FIG. 2, each inventive current source comprises a JFET Q6 having a source coupled to a source of supply voltage $V_{CC}$ and having a drain at which the required current $I_1$, $I_2$ is made available. The gate of $Q_6$ is coupled via a trimmable resistor $R_T$ to the source of supply $V_{CC}$. The gate is also coupled to the source of a reference current $I_{REF}$.

The reference current $I_{REF}$ is equal to $V_P/R$ where $V_P$ is the pinch-off voltage of a JFET and R is some resistance. One technique for generating $I_{REF}$ is shown and described in the above referenced copending patent application. Referring again to FIG. 2, $I_1$ or $I_2$ (hereinafter "$I_d$") may be expressed as $$I_d = I_{DSS}(1 - V_{gs}/V_p)^2 \quad (5)$$

where $V_{gs}$ is the gate to source voltage of $Q_6$ and $V_p$ is the pinch-off voltage of $Q_6$. Since the source of $Q_6$ is biased above its gate, $V_{gs}$ may be expressed as $$V_{gs} = I_{REF} R_T R_T \quad (6)$$

Substituting Equation (6) into equation (5) yields $$I_d = I_{DSS}(1 + I_{REF} R_T/V_p)^2 \quad (7)$$

As previously described, $I_{REF}$ equals $V_p/R$. Therefore, $$I_d = I_{DSS}(1 + V_p R_T/V_p R)^2 \quad (8)$$

As long as JFET $Q_6$ and the current source generating $I_{REF}$ are in close proximity, their pinch-off voltages will be substantially equal and Equation (8) becomes $$I_d = I_{DSS}(1 + R_T/R)^2 \quad (9)$$

Thus, it can be seen that $I_d$ appearing at the drain of JFET $Q_6$ is proportional $I_{DSS}$ and may be trimmed simply by altering the ratio of $R_T/R$. This is accomplished by adjusting trimmable resistor $R_T$. Through this mechanism, $I_d$ may be adjusted so as to be equal to $I_{DSS}$.

If we next assume that resistors R and $R_T$ are of the same type, then $$dR/dT = dR_T/dT \quad (10)$$

and the temperature coefficient of R is substantially identical to that of $R_T$. That is $$dI_d/dT = (dT_{DSS}/dT)(1 + R_T/R)^2 \quad (11)$$

This being the case, the temperature coefficient of $I_D$ is proportional to that $I_{DSS}$. Thus, the circuit shown in FIG. 2 when driven by a reference current equal to $V_P/R$ produces a current $I_d$ which is proportional to $I_{DSS}$ and trimmable and one which has a temperature coefficient which is proportional to that of $I_{DSS}$.

Aside from the above, the operational amplifier shown in FIG. 1 operates in the well known manner. That is, when the voltage at terminal 10 is greater than that at terminal 12, JFET Q1 turns on causing the voltage at the base of transistor Q3 to fall thus turning it on. The current flowing in the collector of Q3 will thus be greater than that flowing in the collector of Q4. Since the current mirror action of diode D1 and transistor Q5 will attempt to mirror the current flowing in the collector of Q3 in the collector of Q5, the voltage at node 14 which is applied to the amplifier's output stage will fall. In contrast, should the potential at input terminal 10 be less than that at terminal 12, JFET Q2 will turn on causing transistor Q4 to conduct harder than transistor Q3. In this case, the current being mirrored to the collector of transistor Q5 is less than that flowing in the collector of transistor Q4 and the voltage at node 14 will rise.

The above description is given by way of example only. Changes in form and details may be made by one skilled in the art without departing from the scope of the invention as defined by the appended claims.

We claim:

1. An amplifier having first and second inputs, comprising:
    first and second emitter coupled transistor each having a base, collector and emitter terminals, said emitter terminals for coupling to a first source of supply voltage;
    current mirror means coupled to the collectors of said first and second transistor;
    a first JFET having a source coupled to the base of said first transistor, a drain for coupling to a second source of supply voltage, and a gate coupled to said first input, and having a first $I_{DSS}$;
    a second JFET having a source coupled to the base of said second transistor, a drain for coupling to said second source of supply voltage, and a gate coupled to said second input, and having a second $I_{DSS}$;
    first means coupled to the source of said first JFET for supplying a first current thereto substantially equal to said first $I_{DSS}$; and
    second means coupled to the source of said second JFET for supplying a second current thereto substantially equal to said second $I_{DSS}$.

2. An amplifier according to claim 1 wherein said first and second transistors are PNP transistors.

3. An amplifier according to claim 1 wherein each of said first and second means comprises:
    a third JFET having a source terminal for coupling to said first source of supply voltage, a drain terminal for conducting said first current, and a gate terminal; and
    an adjustable resistor having a first end for coupling to said first source of supply voltage and a second end coupled to the gate terminal of said third JFET and to a source of a reference current.

4. An amplifier according to claim 3 wherein said reference current is proportional to the pinch-off voltage of said third JFET.

5. An improved amplifier of the type which includes a pair of differentially coupled transistors having base, emitter and collector terminals, the emitter terminals for coupling to a first source of supply voltage and the collector terminals for driving a current mirror circuit, and further including a pair of JFET followers each having a source coupled to the base of one of the transistors, a gate coupled to one of the amplifier's inputs, and a drain for coupling to a second source of supply voltage, the improvement comprising:
    first and second means coupled to the source terminals of said first and second JFET followers respectively for supplying a current thereto substantially equal to $I_{DSS}$ of each of said first and second JFET followers respectively.

* * * * *